US012174222B2

(12) United States Patent
Chung et al.

(10) Patent No.: US 12,174,222 B2
(45) Date of Patent: Dec. 24, 2024

(54) VOLTAGE DETECTION DEVICE

(71) Applicant: ASUSTeK COMPUTER INC., Taipei (TW)

(72) Inventors: Wei-Gen Chung, Taipei (TW); Ming-Ting Tsai, Taipei (TW); Hsi-Ho Hsu, Taipei (TW); Chun-San Lin, Taipei (TW); Wei Kao, Taipei (TW); Chen-Hao Yu, Taipei (TW); Hsiang-Jui Hung, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 152 days.

(21) Appl. No.: 17/969,697

(22) Filed: Oct. 20, 2022

(65) Prior Publication Data

US 2024/0061018 A1 Feb. 22, 2024

(30) Foreign Application Priority Data

Aug. 18, 2022 (TW) .................................. 111131074

(51) Int. Cl.
*G01R 15/04* (2006.01)
*H02H 3/20* (2006.01)
*H03F 3/45* (2006.01)
*H03K 17/687* (2006.01)

(52) U.S. Cl.
CPC .............. *G01R 15/04* (2013.01); *H02H 3/20* (2013.01); *H03F 3/45071* (2013.01); *H03K 17/687* (2013.01)

(58) Field of Classification Search
CPC .................... G01R 15/04; G01R 19/16576; G01R 15/005; G01R 19/16519; G01R 19/16538; H02H 3/20; H03F 3/45071; H03K 17/687; H03K 17/302
USPC ....................................................... 324/76.11
See application file for complete search history.

(56) References Cited

U.S. PATENT DOCUMENTS

| 2,946,951 A | * | 7/1960 | Boode ..................... G01R 27/02 324/705 |
| 8,913,361 B2 | | 12/2014 | Li |
| 2018/0323609 A1 | * | 11/2018 | Goyal ..................... G06F 3/044 |

(Continued)

FOREIGN PATENT DOCUMENTS

| CN | 101546204 | 2/2011 |
| CN | 103187713 | 7/2013 |
| WO | 2022167405 | 8/2022 |

*Primary Examiner* — Christopher P McAndrew
(74) *Attorney, Agent, or Firm* — JCIPRNET (57) ABSTRACT

A voltage detection device is provided. The voltage detection device includes a first voltage divider circuit, a comparison circuit, and a second voltage divider circuit. The first voltage divider circuit is configured to receive an input voltage and output a comparison voltage according to the input voltage. The comparison circuit is configured to receive the comparison voltage to compare the comparison voltage with a reference voltage and determine whether to change a trigger signal according to a comparison result. The second voltage divider circuit is configured to receive the input voltage. When the input voltage is greater than or equal to a predetermined voltage value, the second voltage divider circuit and the first voltage dividing circuit form a parallel structure to pull down the comparison voltage.

10 Claims, 6 Drawing Sheets

(56) References Cited

U.S. PATENT DOCUMENTS

2020/0278710 A1* 9/2020 Sankman ................ G05F 1/575
2022/0381807 A1* 12/2022 Yoo .................. G01R 19/16552

* cited by examiner

VOLTAGE DETECTION DEVICE

CROSS-REFERENCE TO RELATED APPLICATION

This application claims the priority benefit of Taiwan application serial no. 111131074, filed on Aug. 18, 2022. The entirety of the above-mentioned patent application is hereby incorporated by reference herein and made a part of this specification.

BACKGROUND

Technical Field

The disclosure relates to a voltage detection device, and more particularly to a voltage detection device capable of supporting a large voltage range.

Description of Related Art

As electronic devices are used more and more frequently in daily life, in order to complete charging of the electronic devices within a short period of time, the conventional electronic devices are equipped with transmission interfaces with universal serial bus (USB) Type-C specifications. Such USB Type-C interface offers a super-fast charging mode and has a transmission rate of up to 10 Gbps. In the USB Power Delivery 3.1 (USB PD 3.1) specification previously introduced by the USB association, the extend power range (EPR) function was added to expand the supported voltage range from 5 volts to 20 volts to 5 volts to 48 volts.

For the requirement of overvoltage protection in the charging mode, the traditional manner may be mainly divided into two types, a charger integrated chip (IC) with a built-in overvoltage protection mechanism and an overvoltage protection IC (OVP IC) with an external overvoltage protection mechanism. However, the built-in overvoltage protection mechanism of the charger IC is limited by the specifications of the charger IC itself, which limits the adjustable protection point and the response speed.

In addition, the current charging structure of the external overvoltage protection IC mainly supports the voltage range of 5 volts to 20 volts and does not directly support higher voltage points. If it is intended to take the higher voltage point into consideration, a voltage divider circuit needs to be externally connected to the overvoltage protection IC. However, since each overvoltage protection IC is limited by its own minimum operating voltage, the charging function in the low voltage range is sacrificed while using the voltage dividing manner to achieve the charging function that supports the high voltage range, which still cannot effectively support the voltage range of 5 volts to 48 volts.

SUMMARY

According to an aspect of this disclosure, a voltage detection device is provided. The voltage detection device includes a first voltage divider circuit, a comparison circuit, and a second voltage divider circuit. The first voltage divider circuit is configured to receive an input voltage and output a comparison voltage according to the input voltage. The comparison circuit is coupled to the first voltage divider circuit. The comparison circuit is configured to receive the comparison voltage to compare the comparison voltage with a reference voltage and determine whether to change a trigger signal according to a comparison result. The second voltage divider circuit is coupled to the first voltage divider circuit. The second voltage divider circuit is configured to receive the input voltage. When the input voltage is greater than or equal to a predetermined voltage value, the second voltage divider circuit and the first voltage divider circuit form a parallel structure to pull down the comparison voltage.

Based on the above, the voltage detection device of the disclosure can dynamically change the relation between the input voltage and the comparison voltage. The comparison voltage is pulled down when the input voltage is greater than or equal to the predetermined voltage value, so that the system can support a large voltage range of 5 volts to 48 volts without triggering overvoltage protection within the supportable voltage range.

In order for the features and advantages of the disclosure to be more comprehensible, the following specific embodiments are described in detail in conjunction with the drawings.

DETAILED DESCRIPTION OF DISCLOSED EMBODIMENTS

Reference will now be made in detail to the exemplary embodiments of the disclosure, examples of which are illustrated in the drawings. Wherever possible, the same reference numerals are used in the drawings and the description to refer to the same or similar parts.

Figure 1:
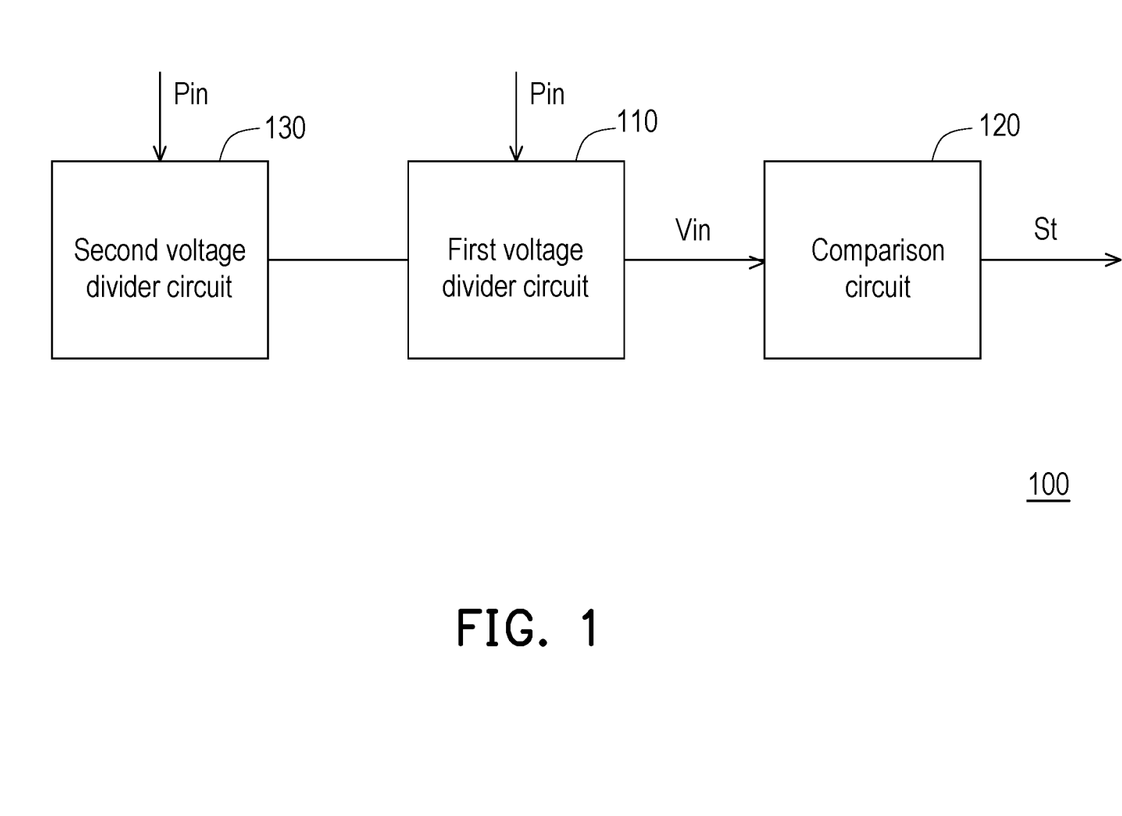
FIG. 1 is a schematic block diagram of a voltage detection device according to an embodiment of the disclosure.

Please refer to FIG. 1. A voltage detection device 100 of the embodiment may be used as an external overvoltage protection IC. As shown in FIG. 1, the voltage detection device 100 includes a first voltage divider circuit 110, a comparison circuit 120, and a second voltage divider circuit 130. The first voltage divider circuit 110 is configured to receive an input voltage Pin and output a comparison voltage Vin according to the input voltage Pin. The input voltage Pin is, for example, a voltage from a detection point for executing overvoltage protection. The first voltage divider circuit 110 may divide the input voltage Pin to output the comparison voltage Vin at a voltage dividing point.

The comparison circuit 120 is coupled to the first voltage divider circuit 110. The comparison circuit 120 is configured to receive the comparison voltage Vin to compare the comparison voltage Vin with a reference voltage Vref and determine whether to change a trigger signal St according to a comparison result. Specifically, when the comparison voltage Vin is less than the reference voltage Vref, the comparison circuit 120 may maintain the trigger signal St at a first logic level, which indicates that the input voltage Pin is within a supported voltage range. When the comparison voltage Vin is greater than or equal to the reference voltage Vref, the comparison circuit 120 may change the trigger signal St to a second logic level, which indicates that the input voltage Pin is not within the supported voltage range, and overvoltage protection is triggered. In the embodiment, the supported voltage range is, for example, 5 volts to 48 volts.

In the embodiment, the first logic level is logic 1, and the second logic level is logic 0 that is complementary to the first logic level. However, in other embodiments, the first logic level may be logic 0, and the second logic level may also be logic 1 that is complementary to the first logic level. The disclosure is not limited thereto.

The second voltage divider circuit 130 is coupled to the first voltage divider circuit 110. The second voltage divider circuit 130 is configured to receive the input voltage Pin. When the input voltage Pin is greater than or equal to a predetermined voltage value Vmiddle, the second voltage divider circuit 130 and the first voltage divider circuit 110 form a parallel structure to pull down the comparison voltage Vin. When the input voltage Pin is less than the predetermined voltage value Vmiddle, the second voltage divider circuit 130 and the first voltage divider circuit 110 do not form the parallel structure, so the comparison voltage Vin is not affected. In this way, the voltage detection device 100 of the embodiment may dynamically change the voltage ratio of the input voltage Pin to the comparison voltage Vin. A higher input voltage Pin is required to change the trigger signal St to the second logic level to trigger overvoltage protection, so that the system operates normally under the condition of a large voltage range (for example, 5 volts to 48 volts) and can set a protection point of a high voltage.

Figure 2:
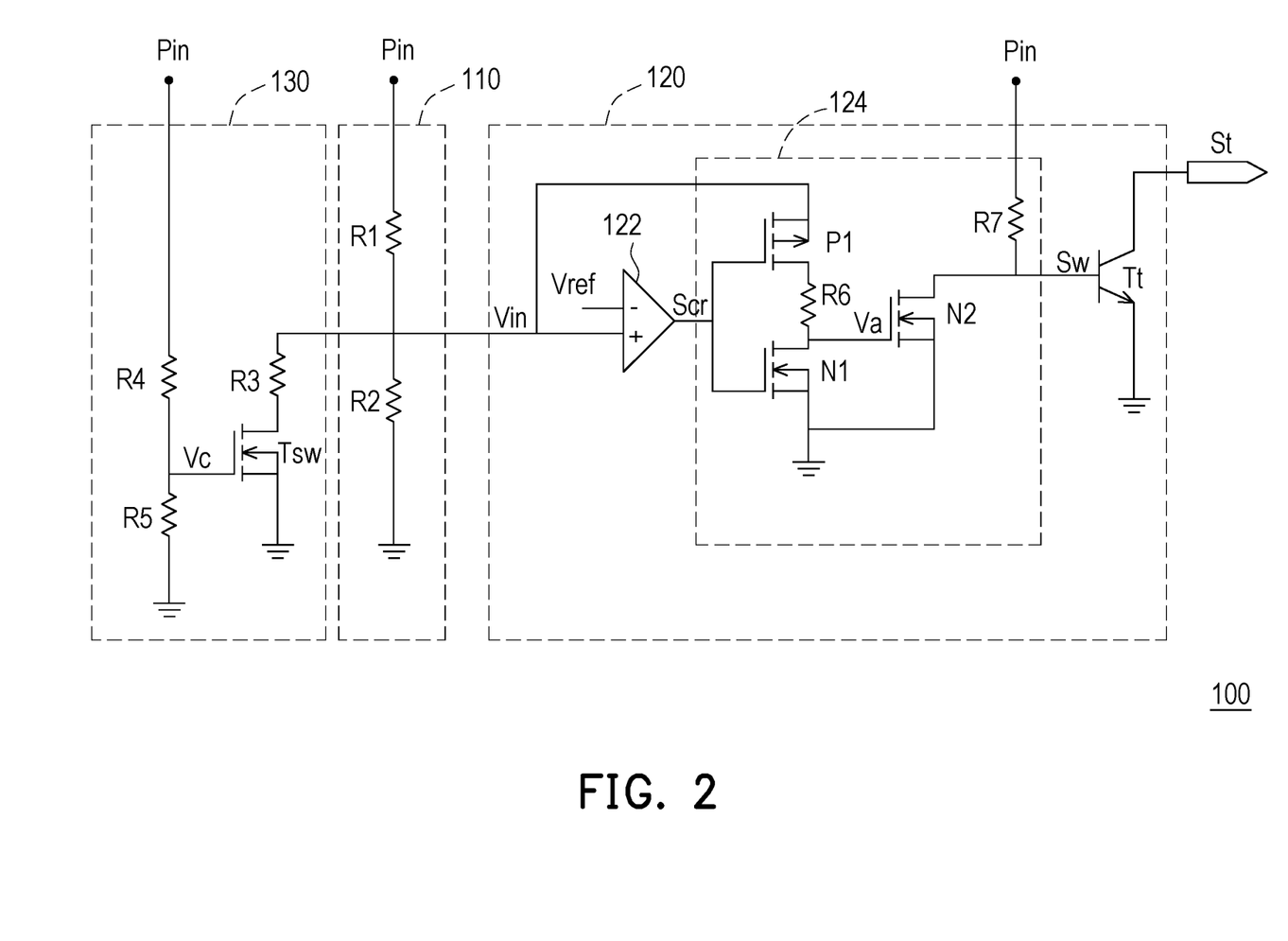
FIG. 2 is a schematic circuit diagram of a voltage detection device according to an embodiment of the disclosure.

In order to describe the operating manner of the voltage detection device 100 in more detail, please refer to FIG. 2 below to illustrate the circuit structures of the first voltage divider circuit 110, the comparison circuit 120, and the second voltage divider circuit 130 in the embodiment. As shown in FIG. 2, the first voltage divider circuit 110 includes a first resistor R1 and a second resistor R2. A first terminal of the first resistor R1 is used to receive the input voltage Pin. A first terminal of the second resistor R2 is coupled to a second terminal of the first resistor R1, and a second terminal is coupled to a ground potential (0 V). The first voltage divider circuit 110 is used to divide the input voltage Pin to output the comparison voltage Vin at the second terminal of the first resistor R1.

The second voltage divider circuit 130 includes a third resistor R3, a switching transistor Tsw, a fourth resistor R4, and a fifth resistor R5. A first terminal of the third resistor R3 is coupled to the second terminal of the first resistor R1. A first terminal of the switching transistor Tsw is coupled to a second terminal of the third resistor R3, and a second terminal is coupled to the ground potential. A first terminal of the fourth resistor R4 is used to receive the input voltage Pin, and a second terminal is coupled to a control terminal of the switching transistor Tsw. A first terminal of the fifth resistor R5 is coupled to a second terminal of the fourth resistor R4, and a second terminal is coupled to the ground potential. The second voltage divider circuit 130 is used to divide the input voltage Pin to provide a control voltage Vc to the switching transistor Tsw at the second terminal of the fourth resistor R4. In the embodiment, the reference voltage Vref is, for example, 2.5 volts to 4.5 volts, the first resistor R1 is, for example, 200 k ohms, the second resistor R2 is, for example, 46 k ohms, the third resistor R3 is, for example, 32 k ohms, the fourth resistor R4 is, for example, 200 k ohms, and the fifth resistor R5 is, for example, 10 k ohms, but the disclosure is not limited thereto, and persons skilled in the art may make adjustments according to actual requirements. In addition, the switching transistor Tsw is, for example, an N-type metal-oxide-semiconductor field-effect transistor (MOSFET), but may be replaced by any switching circuit. The predetermined voltage value Vmiddle may depend on a threshold voltage value Vth of the switching transistor Tsw.

When the input voltage Pin is greater than or equal to the predetermined voltage value Vmiddle, the switching transistor Tsw is controlled by the control voltage Vc to be turned on, so that the second resistor R2 and the third resistor R3 are connected in parallel. In this way, a resistance value formed after the parallel connection will be less than the original resistance value of the third resistor R3, which changes the voltage dividing ratio of the first voltage divider circuit 110. In other words, the voltage ratio of the input voltage Pin to the comparison voltage Vin also changes accordingly to pull down the comparison voltage Vin.

The comparison circuit 120 includes an operational amplifier 122, a buffer circuit 124, and a trigger transistor Tt. A non-inverting input terminal of the operational amplifier 122 is used to receive the comparison voltage Vin, an inverting input terminal is used to receive the reference voltage Vref, and an output terminal generates a comparison result signal Scr.

The buffer circuit 124 is coupled to the operational amplifier 122. The buffer circuit 124 may receive the comparison result signal Scr and generate a corresponding switching signal Sw according to the comparison result signal Scr.

A first terminal of the trigger transistor Tt is used to output the trigger signal St, a second terminal is coupled to the ground potential, and a control terminal is used to receive the switching signal Sw. The trigger transistor Tt may be controlled by the switching signal Sw to be turned on or off, so as to change the logic level of the trigger signal St.

As shown in FIG. 2, the buffer circuit 124 includes a first P-type MOSFET P1, a sixth resistor R6, a first N-type MOSFET N1, a seventh resistor R7, and a second N-type MOSFET N2. A first terminal of the first P-type MOSFET P1 is coupled to the non-inverting input terminal of the operational amplifier 122, and a control terminal is coupled to the output terminal of the operational amplifier 122.

A first terminal of the sixth resistor R6 is coupled to a second terminal of the first P-type MOSFET P1. A first terminal of the first N-type MOSFET N1 is coupled to a second terminal of the sixth resistor R6, a second terminal is coupled to the ground potential, and a control terminal is coupled to the output terminal of the operational amplifier 122.

A first terminal of the seventh resistor R7 is used to receive the input voltage Pin. A first terminal of the second N-type MOSFET N2 is coupled to a second terminal of the seventh resistor R7 and the control terminal of the trigger transistor Tt, a second terminal is coupled to the ground potential, and a control terminal is coupled to the first terminal of the first N-type MOSFET N1.

As shown in FIG. 2, the circuit structure of the buffer circuit 124 causes the comparison result signal Scr and a buffer signal Va generated by the first terminal of the first N-type MOSFET N1 to be mutually inverse, and the buffer signal Va and the switching signal Sw are mutually inverse. Furthermore, the trigger transistor Tt is, for example, a negative-positive-negative (NPN) bipolar transistor, but may be replaced by any switching circuit. The trigger transistor Tt is turned off when the switching signal Sw is logic 0, and the trigger transistor Tt is turned on when the switching signal Sw is logic 1.

Figure 3:
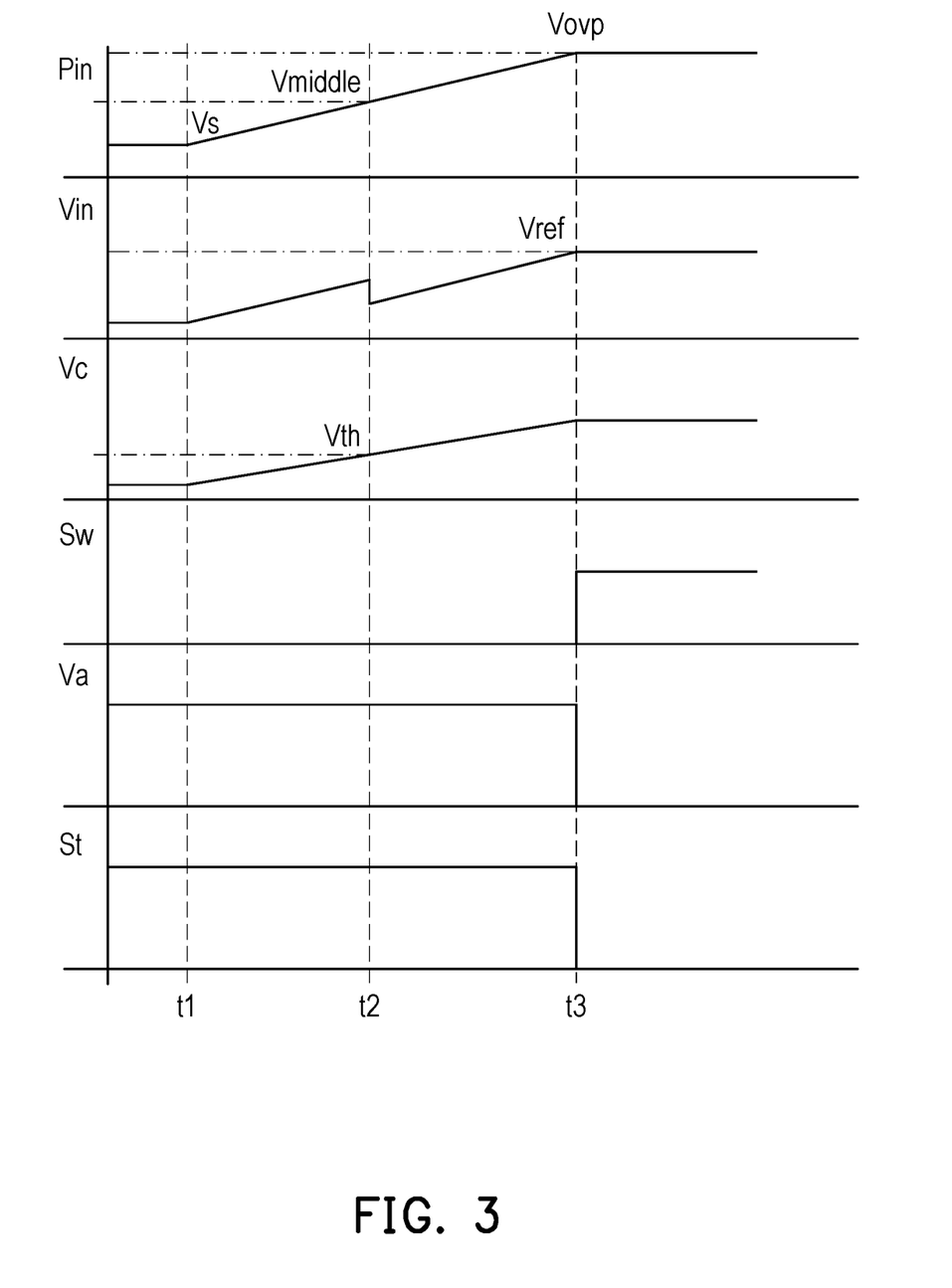
FIG. 3 is a schematic diagram of signal waveforms of a voltage detection device according to an embodiment of the disclosure.

Please refer to FIG. 3. FIG. 3 shows signal waveforms of the input voltage Pin, the comparison voltage Vin, the control voltage Vc, the switching signal Sw, the buffer signal Va, and the trigger signal St in the voltage detection device 100. It can be observed from FIG. 3 that the signal waveform changes during the period when the input voltage Pin rises from an initial voltage value Vs to an overvoltage protection value Vovp. In the embodiment, the initial voltage value Vs is, for example, 5 volts, and the overvoltage protection value Vovp may be set to be slightly greater than 48 volts, such as 51 volts.

As shown in FIG. 3, at a time point t1, the input voltage Pin starts to rise from the initial voltage value Vs. The comparison voltage Vin and the control voltage Vc also start to rise accordingly. At this time, the control voltage Vc does not turn on the switching transistor Tsw, the second resistor R2 and the third resistor R3 are not connected in parallel, and the input voltage Pin and the comparison voltage Vin maintain the initial voltage ratio. In addition, since the comparison voltage Vin is less than the reference voltage Vref, the comparison result signal Scr is logic 0, the buffer signal Va is logic 1, and the switching signal Sw inverse to the buffer signal Va is logic 0. Therefore, the switching signal Sw does not turn on the trigger transistor Tt, but maintains the trigger signal St at logic 1.

When a time point t2 is reached, the input voltage Pin rises to the predetermined voltage value Vmiddle, and the control voltage Vc rises to the threshold voltage value Vth. At this time, the control voltage Vc turns on the switching transistor Tsw, so that the second resistor R2 and the third resistor R3 are connected in parallel. Therefore, the voltage ratio of the input voltage Pin to the comparison voltage Vin is changed, and the comparison voltage Vin is pulled down. In addition, since the pulled-down comparison voltage Vin is less than the reference voltage Vref, the comparison result signal Scr is logic 0, the buffer signal Va is logic 1, and the switching signal Sw inverse to the buffer signal Va is logic 0. Therefore, the switching signal Sw still does not turn on the trigger transistor Tt, but maintains the trigger signal St at logic 1.

When a time point t3 is reached, the input voltage Pin rises to the overvoltage protection value Vovp. At this time, even if the comparison voltage Vin has been pulled down due to the parallel structure of the second resistor R2 and the third resistor R3, the comparison voltage Vin is still greater than or equal to the reference voltage Vref, the comparison result signal Scr becomes logic 1, the buffer signal Va becomes logic 0, and the switching signal Sw inverse to the buffer signal Va becomes logic 1. Therefore, the switching signal Sw turns on the trigger transistor Tt to change the trigger signal St to logic 0, which indicates that overvoltage protection is triggered.

In addition to the circuit structures described above, the buffer circuit of the disclosure may also be configured in other manners, as long as the buffer circuit can have the same effects. Three other embodiments are exemplified below for description.

Figure 4:
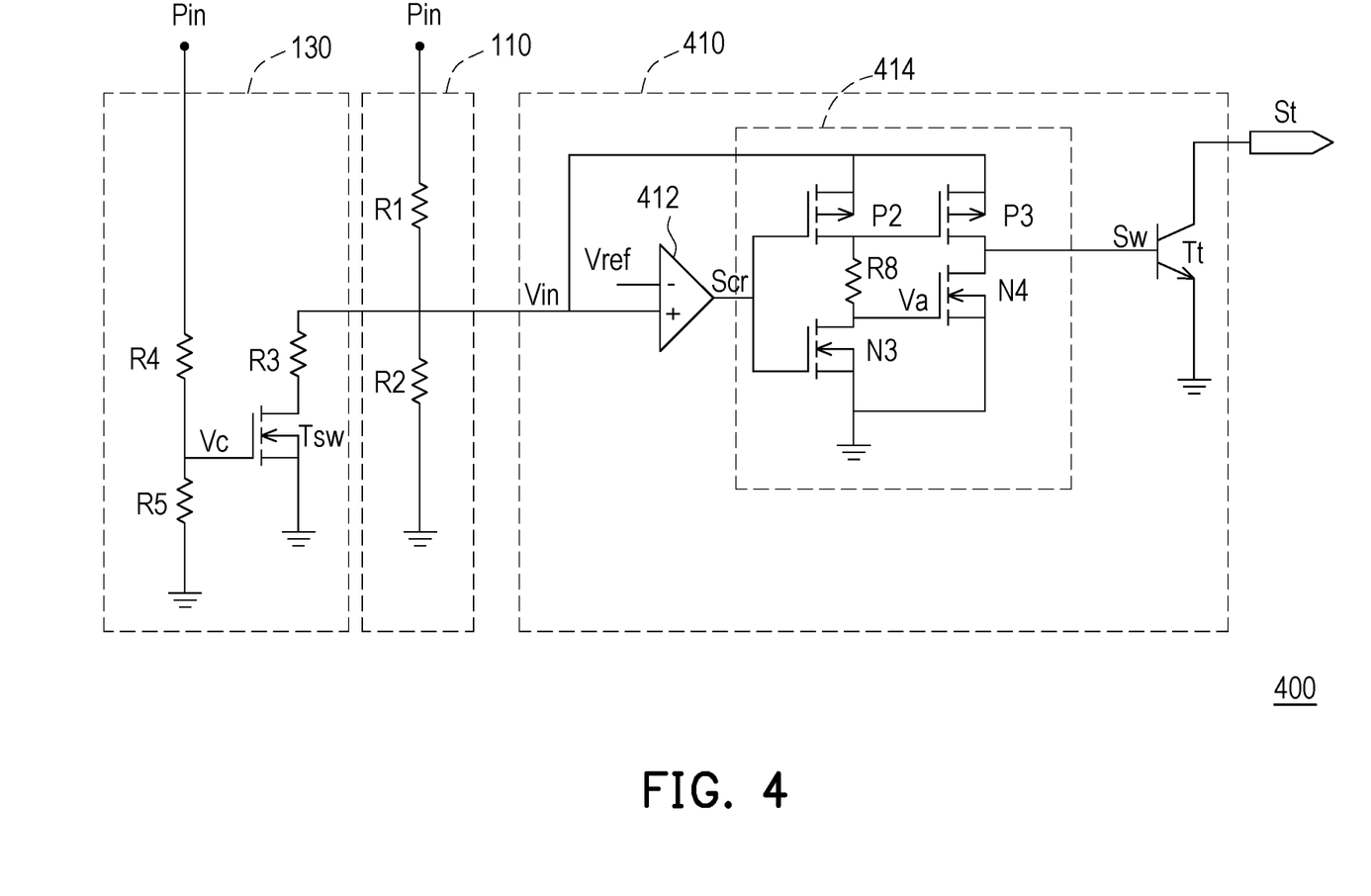
FIG. 4 is a schematic circuit diagram of a voltage detection device according to an embodiment of the disclosure.

In the embodiment shown in FIG. 4, a voltage detection device 400 includes a first voltage divider circuit 110, a comparison circuit 410, and a second voltage divider circuit 130. The comparison circuit 410 includes an operational amplifier 412, a buffer circuit 414, and a trigger transistor Tt. The buffer circuit 414 is coupled to the operational amplifier 412. A non-inverting input terminal of the operational amplifier 412 is used to receive a comparison voltage Vin, an inverting input terminal is used to receive a reference voltage Vref, and an output terminal generates a comparison result signal Scr. The trigger transistor Tt may be controlled by a switching signal Sw to be turned on or off, so as to change the logic level of a trigger signal St.

Different from the previous embodiment, in the embodiment, the buffer circuit 414 includes a second P-type MOSFET P2, an eighth resistor R8, a third N-type MOSFET N3, a third P-type MOSFET P3, and a fourth N-type MOSFET N4. A first terminal of the second P-type MOSFET P2 is coupled to the non-inverting input terminal of the operational amplifier 412, and a control terminal is coupled to the output terminal of the operational amplifier 412. A first terminal of the eighth resistor R8 is coupled to a second terminal of the second P-type MOSFET P2. A first terminal of the third N-type MOSFET N3 is coupled to a second terminal of the eighth resistor R8, a second terminal is coupled to a ground potential, and a control terminal is coupled to the output terminal of the operational amplifier 412. A first terminal of the third P-type MOSFET P3 is coupled to the non-inverting input terminal of the operational amplifier, and a control terminal is coupled to the second terminal of the second P-type MOSFET P2. A first terminal of the fourth N-type MOSFET N4 is coupled to a second terminal of the third P-type MOSFET P3 and a control terminal of the trigger transistor Tt, a second terminal is coupled to the ground potential, and a control terminal is coupled to the first terminal of the third N-type MOSFET N3. Based on the above circuit configuration, the buffer circuit 414 may receive the comparison result signal Scr and generate the corresponding switching signal Sw according to the comparison result signal Scr.

Figure 5:
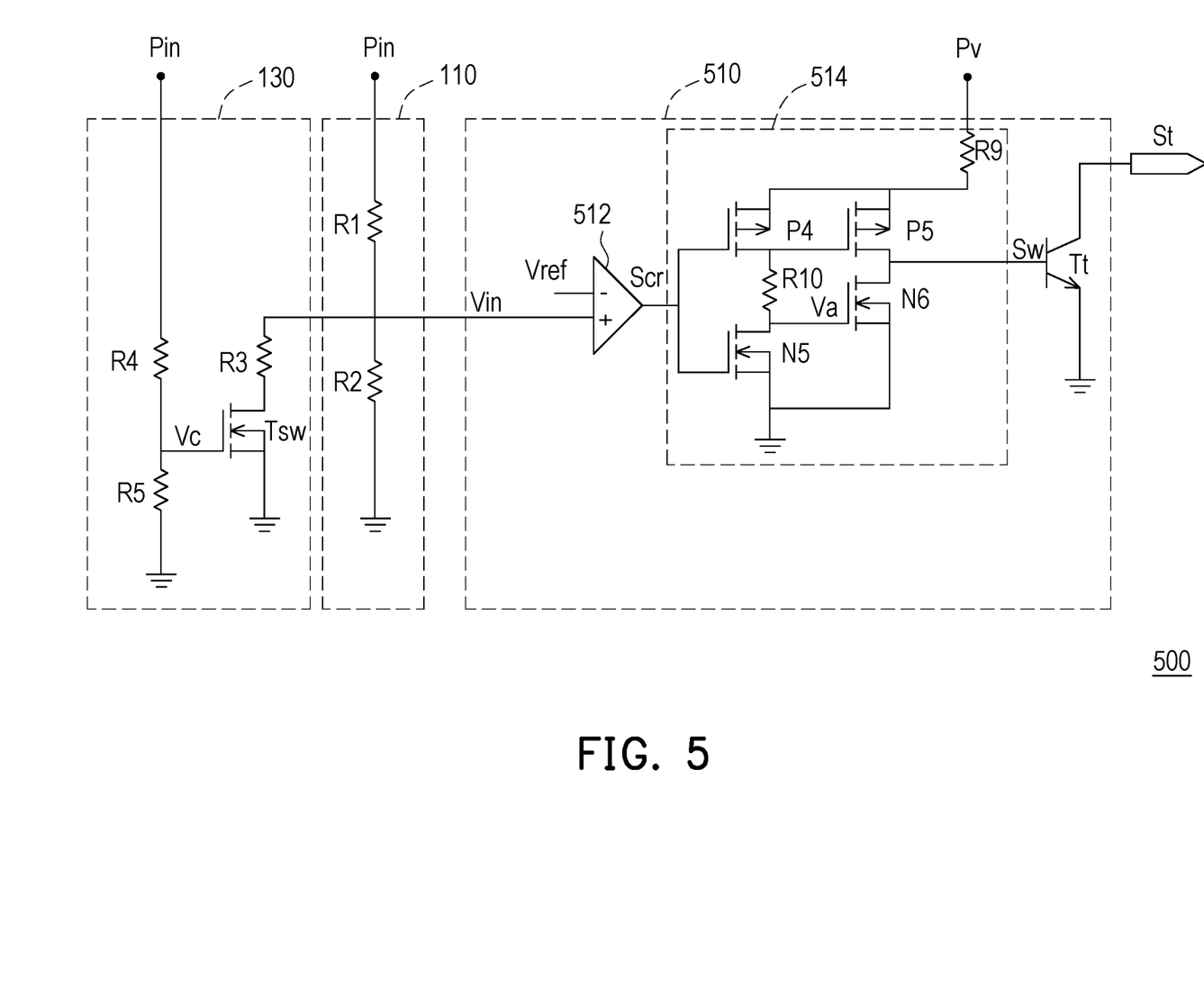
FIG. 5 is a schematic circuit diagram of a voltage detection device according to an embodiment of the disclosure.

In the embodiment shown in FIG. 5, a voltage detection device 500 includes a first voltage divider circuit 110, a comparison circuit 510, and a second voltage divider circuit 130. The comparison circuit 510 includes an operational amplifier 512, a buffer circuit 514, and a trigger transistor Tt. The buffer circuit 514 is coupled to the operational amplifier 512. A non-inverting input terminal of the operational amplifier 512 is used to receive a comparison voltage Vin, an inverting input terminal is used to receive a reference voltage Vref, and an output terminal generates a comparison result signal Scr. The trigger transistor Tt may be controlled by a switching signal Sw to be turned on or off, so as to change the logic level of a trigger signal St.

Different from the previous embodiment, in the embodiment, the buffer circuit 514 includes a ninth resistor R9, a fourth P-type MOSFET P4, a tenth resistor R10, a fifth N-type MOSFET N5, a fifth P-type MOSFET P5, and a sixth N-type MOSFET N6. A first terminal of the ninth resistor R9 is used to receive an operating voltage Pv. A first terminal of the fourth P-type MOSFET P4 is coupled to a second terminal of the ninth resistor R9, and a control terminal is coupled to the output terminal of the operational amplifier 512. A first terminal of the tenth resistor R10 is coupled to a second terminal of the fourth P-type MOSFET P4. A first terminal of the fifth N-type MOSFET N5 is coupled to a second terminal of the tenth resistor R10, a second terminal is coupled to a ground potential, and a control terminal is coupled to the output terminal of the operational amplifier 512. A first terminal of the fifth P-type MOSFET P5 is coupled to the second terminal of the ninth resistor R9, and a control terminal is coupled to the second terminal of the fourth P-type MOSFET P4. A first terminal of the sixth N-type MOSFET N6 is coupled to a second terminal of the fifth P-type MOSFET P5 and a control terminal of the trigger transistor Tt, a second terminal is coupled to the ground potential, and a control terminal is coupled to the first terminal of the fifth N-type MOSFET N5. In the embodiment, the operating voltage Pv is, for example, 3.3 volts or 5 volts. Based on the above circuit configuration, the buffer circuit 514 may receive the comparison result signal Scr and generate the corresponding switching signal Sw according to the comparison result signal Scr.

Figure 6:
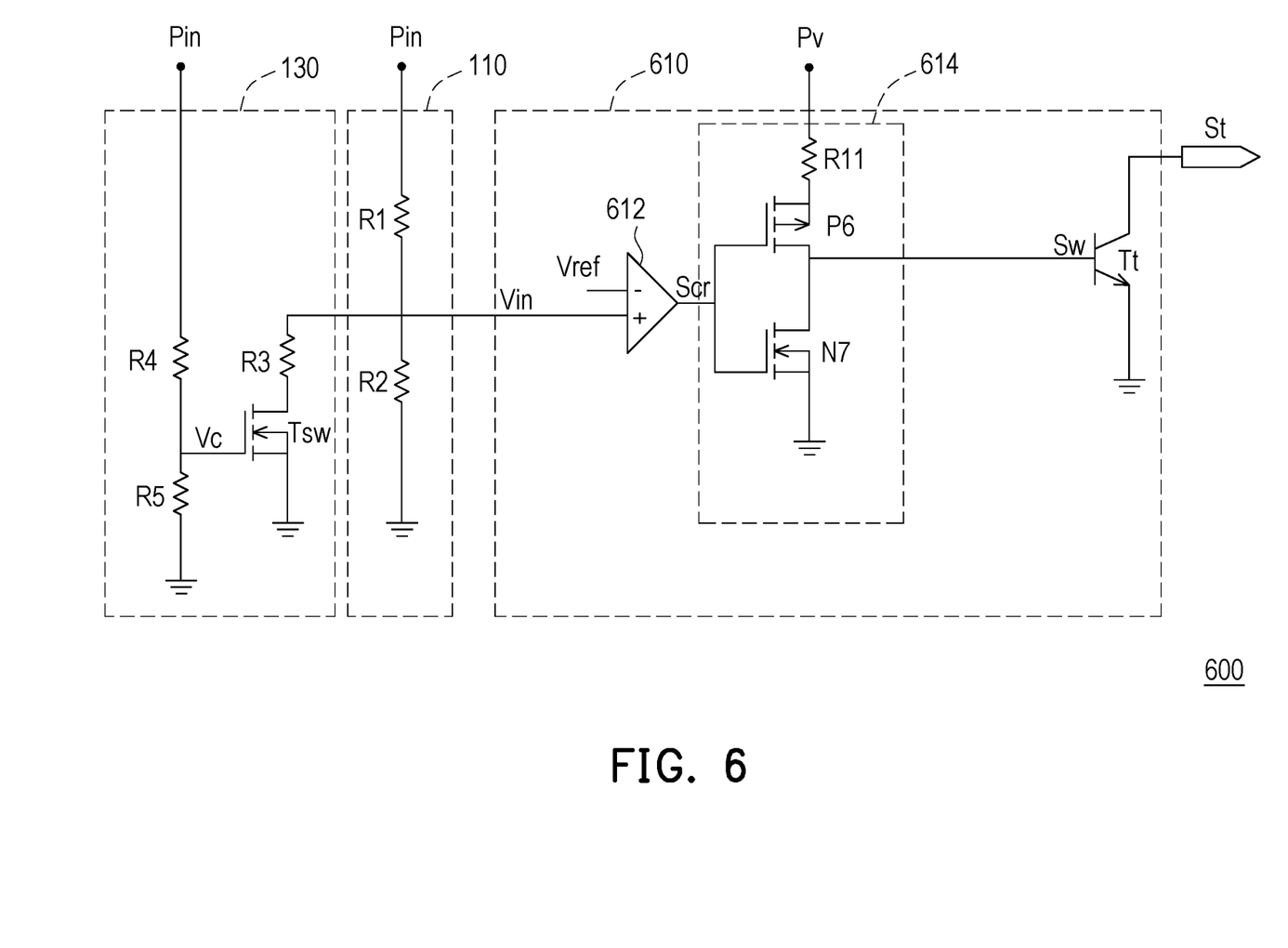
FIG. 6 is a schematic circuit diagram of a voltage detection device according to an embodiment of the disclosure.

In the embodiment shown in FIG. 6, a voltage detection device 600 includes a first voltage divider circuit 110, a comparison circuit 610, and a second voltage divider circuit 130. The comparison circuit 610 includes an operational amplifier 612, a buffer circuit 614, and a trigger transistor Tt. The buffer circuit 614 is coupled to the operational amplifier 612. A non-inverting input terminal of the operational amplifier 612 is used to receive a comparison voltage Vin, an inverting input terminal is used to receive a reference voltage Vref, and an output terminal generates a comparison result signal Scr. The trigger transistor Tt may be controlled by a switching signal Sw to be turned on or off, so as to change the logic level of a trigger signal St.

Different from the previous embodiments, in the embodiment, the buffer circuit 614 includes an eleventh resistor R11, a sixth P-type MOSFET P6, and a seventh N-type MOSFET N7. A first terminal of the eleventh resistor R11 is used to receive an operating voltage Pv. A first terminal of the sixth P-type MOSFET P6 is coupled to a second terminal of the eleventh resistor R11, and a control terminal is coupled to the output terminal of the operational amplifier 612. A first terminal of the seventh N-type MOSFET N7 is coupled to a second terminal of the sixth P-type MOSFET P6 and a control terminal of the trigger transistor Tt, a second terminal is coupled to a ground potential, and a control terminal is coupled to the output terminal of the operational amplifier 612. Based on the above circuit configuration, the buffer circuit 614 may receive the comparison result signal Scr and generate the corresponding switching signal Sw according to the comparison result signal Scr.

In summary, the voltage detection device of the disclosure can dynamically change the relation between the input voltage and the comparison voltage. The comparison voltage is pulled down when the input voltage is greater than or equal to the predetermined voltage value, so that the system operates normally under the condition of a large voltage range (for example, 5 volts to 48 volts) and can set the protection point of the high voltage.

What is claimed is:

1. A voltage detection device, comprising:
   a first voltage divider circuit, configured to receive an input voltage and output a comparison voltage according to the input voltage;
   a comparison circuit, coupled to the first voltage divider circuit and configured to receive the comparison voltage to compare the comparison voltage with a reference voltage and determine whether to change a trigger signal according to a comparison result; and
   a second voltage divider circuit, coupled to the first voltage divider circuit and configured to receive the input voltage and form a parallel structure with the first voltage divider circuit when the input voltage is greater than or equal to a predetermined voltage value to pull down the comparison voltage,
   wherein the comparison circuit comprises:
   an operational amplifier, having a non-inverting input terminal used to receive the comparison voltage, an inverting input terminal used to receive the reference voltage, and an output terminal generating a comparison result signal;
   a buffer circuit, coupled to the operational amplifier, receiving the comparison result signal, and generating a corresponding switching signal according to the comparison result signal; and
   a trigger transistor, having a first terminal used to output the trigger signal, a second terminal coupled to a ground potential, and a control terminal used to receive the switching signal, wherein the trigger transistor is controlled by the switching signal to be turned on or off to change a logic level of the trigger signal.

2. The voltage detection device according to claim 1, wherein when the input voltage is less than the predetermined voltage value, the second voltage divider circuit does not affect the comparison voltage.

3. The voltage detection device according to claim 1, wherein the first voltage divider circuit comprises:
   a first resistor, having a first terminal used to receive the input voltage; and
   a second resistor, having a first terminal coupled to a second terminal of the first resistor and a second terminal coupled to a ground potential,
   wherein the first voltage divider circuit is used to divide the input voltage to output the comparison voltage at the second terminal of the first resistor.

4. The voltage detection device according to claim 3, wherein the second voltage divider circuit comprises:
   a third resistor, having a first terminal coupled to the second terminal of the first resistor;
   a switching transistor, having a first terminal coupled to a second terminal of the third resistor and a second terminal coupled to the ground potential;
   a fourth resistor, having a first terminal used to receive the input voltage and a second terminal coupled to a control terminal of the switching transistor; and
   a fifth resistor, having a first terminal coupled to the second terminal of the fourth resistor and a second terminal coupled to the ground potential,
   wherein the second voltage divider circuit is used to divide the input voltage to provide a control voltage to the switching transistor at the second terminal of the fourth resistor, and when the input voltage is greater than or equal to the predetermined voltage value, the switching transistor is controlled by the control voltage to be turned on, so that the second resistor and the third resistor are connected in parallel.

5. The voltage detection device according to claim 1, wherein the comparison circuit maintains the trigger signal at a first logic level when the comparison voltage is less than the reference voltage,
   the comparison circuit changes the trigger signal to a second logic level when the comparison voltage is greater than or equal to the reference voltage.

6. The voltage detection device according to claim 1, wherein the buffer circuit comprises:
   a first P-type metal-oxide-semiconductor field-effect transistor (MOSFET), having a first terminal coupled to the non-inverting input terminal of the operational amplifier and a control terminal coupled to the output terminal of the operational amplifier;
   a sixth resistor, having a first terminal coupled to a second terminal of the first P-type MOSFET;
   a first N-type MOSFET, having a first terminal coupled to a second terminal of the sixth resistor, a second terminal coupled to the ground potential, and a control terminal coupled to the output terminal of the operational amplifier;

a seventh resistor, having a first terminal used to receive the input voltage; and a second N-type MOSFET, having a first terminal coupled to a second terminal of the seventh resistor and the control terminal of the trigger transistor, a second terminal coupled to the ground potential, and a control terminal coupled to the first terminal of the first N-type MOSFET.

7. The voltage detection device according to claim 1, wherein the buffer circuit comprises:

a second P-type MOSFET, having a first terminal coupled to the non-inverting input terminal of the operational amplifier and a control terminal coupled to the output terminal of the operational amplifier;

an eighth resistor, having a first terminal coupled to a second terminal of the second P-type MOSFET;

a third N-type MOSFET, having a first terminal coupled to a second terminal of the eighth resistor, a second terminal coupled to the ground potential, and a control terminal coupled to the output terminal of the operational amplifier;

a third P-type MOSFET, having a first terminal coupled to the non-inverting input terminal of the operational amplifier and a control terminal coupled to the second terminal of the second P-type MOSFET; and a fourth N-type MOSFET, having a first terminal coupled to a second terminal of the third P-type MOSFET and the control terminal of the trigger transistor, a second terminal coupled to the ground potential, and a control terminal coupled to the first terminal of the third N-type MOSFET.

8. The voltage detection device according to claim 1, wherein the buffer circuit comprises:

a ninth resistor, having a first terminal used to receive an operating voltage;

a fourth P-type MOSFET, having a first terminal coupled to a second terminal of the ninth resistor and a control terminal coupled to the output terminal of the operational amplifier;

a tenth resistor, having a first terminal coupled to a second terminal of the fourth P-type MOSFET;

a fifth N-type MOSFET, having a first terminal coupled to a second terminal of the tenth resistor, a second terminal coupled to the ground potential, and a control terminal coupled to the output terminal of the operational amplifier;

a fifth P-type MOSFET, having a first terminal coupled to the second terminal of the ninth resistor and a control terminal coupled to the second terminal of the fourth P-type MOSFET; and a sixth N-type MOSFET, having a first terminal coupled to a second terminal of the fifth P-type MOSFET and the control terminal of the trigger transistor, a second terminal coupled to the ground potential, and a control terminal coupled to the first terminal of the fifth N-type MOSFET.

9. The voltage detection device according to claim 1, wherein the buffer circuit comprises:

an eleventh resistor, having a first terminal used to receive an operating voltage;

a sixth P-type MOSFET, having a first terminal coupled to a second terminal of the eleventh resistor and a control terminal coupled to the output terminal of the operational amplifier;

a seventh N-type MOSFET, having a first terminal coupled to a second terminal of the sixth P-type MOSFET and the control terminal of the trigger transistor, a second terminal coupled to the ground potential, and a control terminal coupled to the output terminal of the operational amplifier.

10. A voltage detection device, comprising:

a first voltage divider circuit, configured to receive an input voltage and output a comparison voltage according to the input voltage;

a comparison circuit, coupled to the first voltage divider circuit and configured to receive the comparison voltage to compare the comparison voltage with a reference voltage and determine whether to change a trigger signal according to a comparison result; and a second voltage divider circuit, coupled to the first voltage divider circuit and configured to receive the input voltage and form a parallel structure with the first voltage divider circuit when the input voltage is greater than or equal to a predetermined voltage value to pull down the comparison voltage, the second voltage divider circuit and the first voltage divider circuit do not form the parallel structure when the input voltage is less than the predetermined voltage value.

* * * * *